US006204202B1

(12) United States Patent
Leung et al.

(10) Patent No.: US 6,204,202 B1
(45) Date of Patent: Mar. 20, 2001

(54) LOW DIELECTRIC CONSTANT POROUS FILMS

(75) Inventors: Roger Yu-Kwan Leung, San Jose; Suzanne Case, Sunnyvale, both of CA (US)

(73) Assignee: AlliedSignal, Inc., Morristown, NJ (US)

( * ) Notice: Subject to any disclaimer, the term of this patent is extended or adjusted under 35 U.S.C. 154(b) by 0 days.

(21) Appl. No.: 09/291,510

(22) Filed: Apr. 14, 1999

(51) Int. Cl.$^7$ .......................... H01L 21/31; H01L 21/469
(52) U.S. Cl. .......................... 438/781; 438/778; 524/315
(58) Field of Search .................................... 438/781, 778, 438/780, 447, 766, 790; 528/10, 42, 43; 428/294, 447; 525/284, 431; 430/331; 524/315, 317, 366, 376

(56) References Cited

U.S. PATENT DOCUMENTS

| 5,470,801 |   | 11/1995 | Kapoor et al. ................ 537/238 |
| 5,470,802 |   | 11/1995 | Gnade et al. ................. 437/238 |
| 5,494,858 |   | 2/1996  | Gnade et al. ................. 437/231 |
| 5,504,042 |   | 4/1996  | Cho et al. .................... 437/247 |
| 5,523,615 |   | 6/1996  | Cho et al. .................... 257/632 |
| 5,561,318 |   | 10/1996 | Gnade et al. ................. 257/638 |
| 5,723,024 |   | 3/1998  | Berg ........................... 203/57 |
| 5,776,990 |   | 7/1998  | Hedrick et al. ................ 521/77 |
| 5,840,821 | * | 11/1998 | Nakano et al. ................ 438/778 |
| 5,847,443 |   | 12/1998 | Cho et al. .................... 257/632 |
| 5,998,522 | * | 12/1999 | Nakano et al. ................ 524/315 |
| 6,011,123 | * | 1/2000  | Kurosawa et al. ............. 525/431 |
| 6,043,005 | * | 3/2000  | Haq ............................ 430/331 |
| 6,051,321 | * | 4/2000  | Lee et al. ..................... 428/447 |

FOREIGN PATENT DOCUMENTS 0775 669    5/1997 (EP) .

OTHER PUBLICATIONS

Hedrick, J.L. et al, "Polyimide Nanofoams From Aliphatic Polyester–Based Copolymers", Chem. Mater. 10, p. 39–49, Jan. 19, 1998.

Miller, R.D. et, al "Modified Silsesquioxane Structures For Use In Low Dielectric Constant Interconnect Applications" IBM 1998 Proceedings—Dielectrics For ULSI Multilevel Interconnecting Conference.Feb. 16, 1998. p 293–4.

Aoi, Nabuo; "Novel Porous Films Having Low Dielectric Constants Synthesized by Liquid Phase Silylation of Spin–On Sol For Intermetal Dielectrics", Japan J. Appl. Physics, 36, Pt. 1, p1355, 1997.

Hedrick,J.L. et al; "High Temperature Polymer Foams" Polymer 34, 22; p. 4717–26; 1993.

Hedrick, JL, et al; "High Temperature Polyimide Nanofoams for Microelectronic Applications"; Reactive & Functional Polymers 30 (1996) p.; 43–53.

Chemical Abstracts 1997:236938; Vong, Ms.W.,Et Al, Chemical Modification Of Silica Gels. J.Sol–Gel Sci Technol. (1997) 8(1/2/3), p. 499–505.

Chemical Abstracts 194:280887; Matsuda, A. Et al, Changes in Physical Properties and Structures of Sol Gel Derived SiO Films in an Environment of High Temperature and High Humidity. J. Ceram. Soc. Jpn (1994) 102 (Apr.) 330–5.

Chemical Abstracts 1993:450413; Moriya, Y.; Preparation of Polymer Hybrids of the Silica–PVA or Silica–PEG System and Porous Materials Made From the Hybrid Gels. J. Ceram. Soc. Jpn. (1993) 101 (May), 518–21.

Chemical Abstracts 1992:8011: Matsuno, Y.; "Nonreflective Films and their Manufacture"JP Kokai 03199043 A2.

Chemical Abstracts 1995:790919 Bagshaw, S. Et al; "Templating of Mesoporous Molecular Sieves by Nonionic Polyethylene Oxide Surfactants"; Science (1995) 269(5228), 1242–4.

Chemical Abstracts 1986:484023; Ravaine, D.; "A New Family of Organically Modified Silicates Prepared from Gels"; J. Non–Cryst Solids (1986), 82(1–3), 210–19.

Chemical Abstracts 1992:517040; Yazawa, T.; Manufacture of Porous Silica–Based Glass by Sol–Gel Process; JP Kokai 04–1300026 A2.

Chemical Abstracts 1990:428190; Nakanishi, K. "Process for Producing Porous Glass" EP 363697 A1.

Chemical Abstracts 1991:434201, Takei, K., et al Manufacture of Vitreous Silica JP Kokai 03040926 A2.

* cited by examiner

Primary Examiner—David Nelms
Assistant Examiner—Phuc T. Dang
(74) Attorney, Agent, or Firm—Melanie Brown; Leslie Weise

(57) ABSTRACT

The present invention relates to novel low dielectric constant nanoporous dielectric films having improved mechanical strength, and to improved processes for producing the same on substrates suitable for use in the production of integrated circuits. The nanoporous dielectric films are prepared by a process of preparing a mixture of a spin-on-glass material with a suitable thermally degradable polymer that is soluble in polar solvents. The resulting mixture is then applied onto a substrate suitable for use in the production of an integrated circuit, to produce a coated substrate that is heated for a time and at one or more temperatures effective to degrade the polymer, so as to produce the desired low dielectric nanoporous dielectric film.

28 Claims, No Drawings

LOW DIELECTRIC CONSTANT POROUS FILMS

FIELD OF THE INVENTION

The present invention relates to novel low dielectric constant nanoporous films having improved mechanical strength, and to improved processes for producing the same on substrates suitable for use in the production of integrated circuits. The nanoporous films of the invention are prepared using silicon-based starting materials and thermally degradable polymers, copolymers and/or oligomers selected to be soluble in the employed starting materials and in polar solvent systems.

BACKGROUND OF THE INVENTION

As feature sizes in integrated circuits approach 0.25 μm and below, problems with interconnect RC delay, power consumption and signal cross-talk have become increasingly difficult to resolve. It is believed that the integration of low dielectric constant materials for interlevel dielectric (ILD) and intermetal dielectric (IMD) applications will help to solve these problems. While there have been previous efforts to apply low dielectric constant materials to integrated circuits, there remains a longstanding need in the art for further improvements in processing methods and in the optimization of both the dielectric and mechanical properties of such materials used in the manufacture of integrated circuits.

Nanoporous Films

One type of material with a low dielectric constant are nanoporous films prepared from silica, i.e., silicon-based materials. Air has a dielectric constant of 1, and when air is introduced into a suitable silica material having a nanometer-scale pore structure, such films can be prepared with relatively low dielectric constants ("k"). Nanoporous silica materials are attractive because similar precursors, including organic-substituted silanes, e.g., tetraethoxysilane ("TEOS"), are used for the currently employed spin-on-glasses ("S.O.G.") and chemical vapor disposition ("CVD") of silica $SiO_2$. Nanoporous silica materials are also attractive because it is possible to control the pore size, and hence the density, material strength and dielectric constant of the resulting film material. In addition to a low k, nanoporous films offer other advantages including: 1) thermal stability to 900° C., 2) substantially small pore size, i e at least an order of magnitude smaller in scale than the microelectronic features of the integrated circuit), 3) as noted above, preparation from materials such as silica and TEOS that are widely used in semiconductors, 4) the ability to "tune" the dielectric constant of nanoporous silica over a wide range, and 5) deposition of a nanoporous film can be achieved using tools similar to those employed for conventional S.O.G. processing.

Thus, high porosity in silica materials leads to a lower dielectric constant than would otherwise be available from the same materials in nonporous form. An additional advantage, is that additional compositions and processes may be employed to produce nanoporous films while varying the relative density of the material. Other materials requirements include the need to have all pores substantially smaller than circuit feature sizes, the need to manage the strength decrease associated with porosity, and the role of surface chemistry on dielectric constant and environmental stability.

Density (or the inverse, porosity) is the key parameter of nanoporous films that controls the dielectric constant of the material, and this property is readily varied over a continuous spectrum from the extremes of an air gap at a porosity of 100% to a dense silica with a porosity of 0%. As density increases, dielectric constant and mechanical strength increase but the degree of porosity decreases, and vice versa. This suggests that the density range of nanoporous films must be optimally balanced to achieve the desired range of low dielectric constant, and the mechanical properties acceptable for the desired application.

Nanoporous silica films have previously been fabricated by a number of methods. For example, nanoporous films have been prepared using a mixture of a solvent and a silica precursor, which is deposited on a substrate suitable for the purpose.

When forming such nanoporous films, em., by spin-coating, the film coating is typically catalyzed with an acid or base catalyst and additional water to cause polymerization/gelation ("aging") and to yield sufficient strength so that the film does not shrink significantly during drying.

Another previously proposed method for providing nanoporous silica films was based on the observation that film thickness and density/dielectric constant can be independently controlled by using a mixture of two solvents with dramatically different volatility. The more volatile solvent evaporates during and immediately after precursor deposition. The silica precursor, typically partially hydrolyzed and condensed oligomers of TEOS, is applied to a suitable substrate and polymerized by chemical and/or thermal means until it forms a gel. The second solvent, called the Pore Control Solvent (PCS) is usually then removed by increasing the temperature until the film is dry. Assuming that no shrinkage occurs after gelation, the density/dielectric constant of the final film is fixed by the volume ratio of low volatility solvent to silica, as described by EP patent application EP 0 775 669 A2. EP 0 775 669 A2 shows a method for producing a nanoporous silica film by solvent evaporation of one or more polyol solvents, e.g., glycerol, from a metal-based aerogel precursor, but nevertheless fails to provide a nanoporous silica film having sufficiently optimized mechanical and dielectric properties, together with a relatively even distribution of material density throughout the thickness of the film.

Yet another method for producing nanoporous dielectrics is through the use of sol-gel techniques whereby a sol, which is a colloidal suspension of solid particles in a liquid, transforms into a gel due to growth and interconnection of the solid particles. One theory that has been advanced is that through continued reactions within the sol, one or more molecules within the sol may eventually reach macroscopic dimensions so that they form a solid network which extends substantially throughout the sol. At this point, called the gel point, the substance is said to be a gel. By this definition, a gel is a substance that contains a continuous solid skeleton enclosing a continuous liquid phase. As the skeleton is porous, the term "gel" as used herein means an open-pored solid structure enclosing a pore fluid. Removal of the pore fluid leaves behind empty pores.

Protecting the Surfaces of Nanometer Scale Pores

As the artisan will appreciate, a useful nanoporous film must meet a number of criteria, including having a dielectric constant ("k") falling within the required value range, having a suitable thickness ("t") (e.g., measured in Ångstroms), having an ability to effectively fill gaps, such as, e.g., interconductor and/or intercomponent spaces, on patterned wafers, and having an effective degree of hydrophobicity. If the film is not strong enough, despite achieving the other requirements, the pore structure may collapse, resulting in high material density and therefore an undesirably high dielectric constant. In addition, the surfaces of the resulting nano-scale pores carry silanol functional groups or moieties. Silanols, and the water that can be adsorbed onto the silanols from the environment, are highly polarizable and will raise the dielectric constant of the film. Thus, the requirement for hydrophobicity arises from the requirement for a reduced range of dielectric constant relative to previously employed materials. For this reason, preparation of nanoporous dielectric films can also include optional additional processing steps to silylate free silanols on nanopore surfaces of the film, with a capping reagent, e.g., trimethylsilyl [TMS, $(CH_3)_3SiO—$] or other suitable, art-known hydrophobic reagents.

Therefore, despite the availability of previous methods for preparing nanoporous silica films, the art recognizes a need for further, ongoing improvements in both nanoporous silica films and methods for preparing the same. In particular, there remains a continuing need in the art for new processes which eliminate some or all of the aforementioned problems, such as providing methods for making silica nanoporous films of sufficient mechanical strength that are also optimized to have a desirably low and stable dielectric constant, without the need for further processing to make the film hydrophobic.

SUMMARY OF THE INVENTION

In order to solve the above mentioned problems and to provide other improvements, the invention provides novel methods for effectively producing nanoporous silica dielectric films with a low dielectric constant ("k"), e.g., typically ranging from about 1.5 to about 3.8.

Broadly, the dielectric nanoporous films of the invention are prepared by mixing a non-volatile thermally degradable polymer with an organic and/or inorganic silicon-based material or mixture of such materials suitable for forming dielectric films. Such suitable organic and/or inorganic silicon-based material or materials are referred to herein, for convenience and without limitation, as spin-on glass ("S.O.G.") material(s). The resulting mixture of the base material i.e., one or more S.O.G. materials, and the thermally degradable component can optionally form a co-polymer. In any event, this mixture is applied by any art-known methods to a substrate suitable for use in preparing an integrated circuit. The thermally degradable component is then subjected to a process of thermal treatments, leaving behind nanometer-scale voids in the solidified base material. The incorporated nanometer scale voids reduce the density of the base material to provide the desired low dielectric properties.

Thus, the methods of the present invention provide useful compositions which include a low dielectric nanoporous film prepared from materials that include a spin-on glass base material. The low dielectric nanoporous film is produced by the process of preparing a mixture of at least one spin-on-glass material with a suitable thermally degradable polymer that is soluble in a polar solvent; applying the mixture onto a substrate to produce a coated substrate, and heating the coated substrate for a time and at one or more temperatures effective to remove the thermally degradable polymer, so as to produce the desired low dielectric nanoporous film.

The low dielectric nanoporous film produced by this method broadly has a dielectric constant ranging from about 1.5 to about 3.8, and a refractive index ranging from about 1.40 to about 1.10.

In one aspect of the invention, the inventive low dielectric nanoporous film is produced from a spin on glass base material of Formula I:

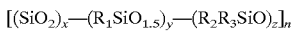

Formula I wherein $R_1$, $R_2$ and $R_3$ are independently selected from the group consisting of an organic moiety and combinations thereof and $1 \geq x \geq 0$; $1 \geq y \geq 0$; $1 \geq z \geq 0$, provided that x+y+z is 1.0.

Preferably, the organic moiety of $R_1$, $R_2$ and/or $R_3$ is a $C_{1-6}$ alkyl.

In a preferred aspect of the invention, the thermally degradable polymer is soluble in a polar solvent, such as water, alcohol, other art-known polar solvents, and/or combinations thereof, as well as being miscible with the selected S.O.G. material(s). In addition, the thermally degradable polymer generally ranges in molecular weight from about 200 to about 2,000,000 Daltons, or greater, In one particular aspect of the invention, the thermally degradable polymer is a polyalkylene oxide, e.g., a polymethylene oxide or polyethylene oxide.

In another aspect of the invention, the heating step includes both a baking step and a curing step, and the baking step includes a plurality of heating steps, ranging in temperature from about 60° C. to about 300° C., and each heating step is conducted for a time period ranging from about 0.5 to about 4 minutes. In addition, the curing step includes heating the baked film at a temperature of at least 400° C. and or a time period ranging from about 10 to about 60 minutes.

Preferably, the substrate on which the low dielectric nanoporous film is formed is suitable for use in producing an integrated circuit, e.g., the substrate is formed of a semiconductor material that includes silicon, gallium arsenide and/or combinations of these.

The invention also provides for a substrate, e.g., an integrated circuit, that includes at least one low dielectric nanoporous film formed by the processes of the invention.

Further, the invention provides for methods for producing the above-described low dielectric nanoporous films on a substrate.

DETAILED DESCRIPTION OF THE PREFERRED EMBODIMENT

Accordingly, nanoporous silica dielectric films having a dielectric constant, or k value, ranging from about 1.5 to about 3.8, can be produced by the methods of the invention.

The films produced by the processes of the invention have a number of advantages over those previously known to the art, including improved mechanical strength to withstand the further processing steps required to prepare integrated circuit on the treated substrate, and a low and stable dielectric constant. The property of a stable dielectric constant is advantageously achieved without the need for further surface modification steps to render the film surface hydrophobic, thus confirming that the silica dielectric films as produced by the processes of the invention are sufficiently hydrophobic as initially formed.

As summarized in the "Description of the Prior Art" above, a number of methods for the preparation of nanoporous silica films on substrates are known to the art. In addition, a number of variations and improvement to these generally known methods for the preparation of nanoporous films are taught by co-owned U.S. patent application Ser. Nos., 09/046,475 and 09/046,473, both filed on Mar. 25, 1998; U.S. patent application Ser. No. 09/054,262, filed on Apr. 3, 1998; and U.S. patent application Ser. Nos. 09/055,244 and 09/055,516, both filed on Apr. 6, 1998, the disclosures of which are incorporated by reference herein in their entireties.

In order to better appreciate the scope of the invention, it should be understood that unless the "SiO$_2$" functional group is specifically mentioned when the term "silica" is employed, the term "silica" as used herein, for example, with reference to nanoporous dielectric films, is intended to refer to dielectric films prepared by the inventive methods from an organic or inorganic glass base material, e.g., any suitable silicon-based material. It should also be understood that the use of singular terms herein is not intended to be so limited, but, where appropriate, also encompasses the plural, e.g., exemplary processes of the invention may be described as applying to and producing a "film" but it is intended that multiple films can be produced by the described, exemplified and claimed processes, as desired.

Broadly, the processes of the invention are conducted by mixing a first component, formed of a suitable base material, such as an S.O.G. material or blend of materials, with a second component that is susceptible to thermal degradation after the film-forming mixture has been applied to a substrate and the resulting film is heated according to the processes described hereinbelow. Further, the second component is formed of one or more relatively non-volatile but thermally degradable polymers, copolymers and/or oligomers, and is miscible with the first component and any polar solvents that may be employed in that mixture. Further still, the thermally labile component is preferably substantially nonvolatile at typical ambient environmental temperatures, e.g., from about 20 to about 200° C., so that no significant evaporation from the spun-on-film will occur prior to heat induced volatilization and solidification of the surrounding film composition.

Thus, once the film-forming mixture is applied by art-standard methods to the substrate, the substrate and the resulting film is heated to a temperature and for a time period sufficient to thermally degrade and/or vaporize the second component so as to leave behind nanometer scale pore structures in the film. In one preferred embodiment the film is then cured. Optionally, the heating steps can be conducted in a plurality of stages, each stage utilizing similar or differing times and temperatures, or combined into a single process step. In a further option, the heating steps can also be conducted so as to combine the curing step and the thermal degradation of the second component.

The compositions and processes of the invention are described in further detail, as follows.

STARTING MATERIALS

Substrates

Broadly speaking, a "substrate" as described herein includes any suitable composition formed before a nanoporous silica film of the invention is applied to and/or formed on that composition. For example, a substrate is typically a silicon wafer suitable for producing an integrated circuit, and the base material from which the nanoporous silica film is formed is applied onto the substrate by conventional methods, e.g., including, but not limited to, the art-known methods of spin-coating and dip-coating. Prior to application of the base materials to form the nanoporous silica film, the substrate surface is optionally prepared for coating by standard, art-known cleaning methods. Suitable substrates for the present invention non-exclusively include semiconductor materials such as gallium arsenide ("GaAs"), silicon and compositions containing silicon such as crystalline silicon, polysilicon, amorphous silicon, epitaxial silicon, and silicon dioxide ("SiO$_2$") and mixtures thereof. On the surface of the substrate is an optional pattern of raised lines, such as metal, oxide, nitride or oxynitride lines which are formed by well known lithographic techniques. Suitable materials for the lines include silica, silicon nitride, titanium nitride, tantalum nitride, aluminum, aluminum alloys, copper, copper alloys, tantalum, tungsten and silicon oxynitride. These lines form the conductors or insulators of an integrated circuit. Such are typically closely separated from one another at distances of about 20 micrometers or less, preferably 1 micrometer or less, and more preferably from about 0.05 to about 1 micrometer. Other optional features of the surface of a suitable substrate include an oxide layer, such as an oxide layer formed by heating a silicon wafer in air, or more preferably, an SiO$_2$ oxide layer formed by chemical vapor deposition of such art-recognized materials as, e.g., plasma enhanced tetraethoxysilane ("PETEOS") silane oxide and combinations thereof, as well as one or more previously formed nanoporous silica dielectric films.

The nanoporous silica film of the invention can be applied so as to cover and/or lie between such optional electronic surface features, e.g., circuit elements and/or conduction pathways that may have been previously formed features of the substrate. Such optional substrate features can also be applied above the nanoporous silica film of the invention in at least one additional layer, so that the low dielectric film serves to insulate one or more, or a plurality of electrically and/or electronically functional layers of the resulting integrated circuit. Thus, a substrate according to the invention optionally includes a silicon material that is formed over or adjacent to a nanoporous silica film of the invention, during the manufacture of a multilayer and/or multicomponent integrated circuit.

In a further option, a substrate bearing a nanoporous silica film or films according to the invention can be further covered with any art known non-porous insulation layer, e.g., a glass cap layer.

First Component—Silicon-Based Polymers

In one embodiment, the starting materials, i.e., the first component, or silica starting material(s) for conducting the processes of the invention, includes organic and/or inorganic base materials suitable for use in coating a substrate. These are typically materials that are suitable for use as spin-on-glasses. Spin-on-glasses (S.O.G.) are dielectric materials that are prepared in a solution form to be used for insulation, planarization and gap-filling in the fabrication of integrated circuits on a suitable substrate (e.g., wafer). S.O.G. solution materials can be applied onto a substrate by any art-known methods, including dipping, brushing, rolling, spraying, but are most typically applied by spin-coating.

Suitable silica, i.e. silicon-based polymers for use in the methods of the invention can be prepared from appropriate functional units, including, for example, at least one of the following.

| | |
|---|---|
| SiO$_2$ | (silica unit); |
| Q$_1$SiO$_{3/2}$ | (silsesquioxane unit); |
| Q$_2$Q$_3$SiO$_2$ | (siloxane unit); and |
| Q$_4$Q$_5$Q$_6$SiO | (end group) | wherein Q$_1$, Q$_2$, Q$_3$, Q$_4$, Q$_5$ and Q$_6$ are organic, and can be the same or different. The term "organic" encompasses any suitable organo-moiety, including alkyl, which can be straight, branched and/or cyclic alkyl, as well as arylalkyl, any of which can be substituted or unsubstituted, and combinations thereof. The "organic" term also encompasses aryl and heteroaryl, substituted and unsubstituted organo-moieties.

Thus, in another embodiment of the invention, when any of $Q_1Q_2$, $Q_3$, $Q_4$, $Q_5$ and $Q_6$ are organic, it is preferred that such moiety be an alkyl, preferably a $C_{1-6}$ alkyl. In another embodiment, any of $Q_1$, $Q_2$, $Q_3$, $Q_4$, $Q_5$ and $Q_6$ can independently be an aryl moiety, preferably a $C_6$–$C_{12}$ aryl.

In yet a still further embodiment of the invention, the base material is an organosiloxane that has the general structure of Formula I, as follows.

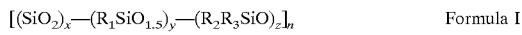

$$[(SiO_2)_x—(R_1SiO_{1.5})_y—(R_2R_3SiO)_z]_n \quad \text{Formula I}$$

wherein $R_1$, $R_2$ and $R_3$ are independently selected organic moiety(ies). Preferably, the organic moiety is an alkyl selected so that the base material is suitable for use as an S.O.G. material, as understood by the art. More preferably, the base material is a $C_{1-6}$ alkyl; and x, y and z each independently range in value from 1 to zero, i e., $1 \geq x \geq 0$; $1 \geq y \geq 0$; $1 \geq z \geq 0$ provided that x+y+z is 1.0.

Further, particular types of base materials each have a preferred range of values for the above described parameters of Formula I, as follows. When the base material is a silica, x is 1. When the base material is a polymethylsilsesquioxane, y is 1 and $R_1$ is methyl. When the base material is AMM512B, x, y and z>0 and $R_1$, $R_2$ and $R_3$ are methyl.

When the base material is AMM311, x, y>0 and z=0 and $R_1$ is methyl. In a preferred embodiment, n ranges from about 100 to about 800, yielding a molecular weight of from about 5,000 to about 45,000. More preferably, n ranges from about 250 to about 650 yielding a molecular weight of from about 14,000 to about 36,000.

In one particular embodiment of the invention, which is exemplified in the provided examples below, the S.O.G. materials include methylsiloxanes. Useful compositions that contain or include methylsiloxanes and that are suitable for use as S.O.G. base materials, are readily available commercially, and include, for example, such products as AMM 311 (Accuglass T-11®); and 512B (Accuglass T-12B®) S.O.G. materials. These are commercially available from Advanced Microelectronic Materials, a subsidiary of the Electronic Materials Division of AlliedSignal Corporation (Sunnyvale, Calif.). The pertinent properties of AMM 311 and AMM 512B are set forth in Table 1, as follows.

TABLE 1

Properties of Commercially Available Methylsiloxanes

| Material Properties | AMM 311 | AMM 512B |
|---|---|---|
| Obtainable Film Thickness Range | 2300–3500 Å | 4900–5200 Å |
| Metal Impurities | ≦10 ppb | ≦20 ppb |
| Shelf-Life | 6 Months at 4° C. | 6 Months at 4° C. |
| Filtration | 0.1 μm | 0.1 μm |
| % solid | 10.5 | 14.7 |
| Organic Content | 10 wt % | 14 wt % |
| Dielectric Constant | 3.8 | 3.1 |
| Refractive Index | 1.39 | 1.38 |
| Solvent System (wt %) | | |
| ethanol, | 23 | 32 |
| 2-propanol, | 36 | 30 |
| acetone, | 18 | 14 |
| water | 8 | 10 |

TABLE 1-continued

Properties of Commercially Available Methylsiloxanes

| Material Properties | AMM 311 | AMM 512B |
|---|---|---|
| Siloxanes: | | |
| $SiO_2$ | 58.0 mole % | 46.3 mole % |
| $CH_3SiO_{1.5}$ | 42.0 | 46.7 |
| $(CH_3)_2SiO$ | 0 | 7.0 |
| Empirical composition after baking at 80, 150 and 250° C., in sequence. | $SiO_{1.78}(CH_3)_{0.42}$ | $SiO_{1.7}(CH_3)_{0.6}$ |

Thermally Degradable Polymer Components

The second component, i.e., the thermally degradable component for use in the processes of the invention, is preferably miscible with the first component. and can optionally form a co-polymer therewith. The thermally degradable component is also sufficiently thermally degradable under the heating conditions employed according to the invention, for forming a useful nanoporous dielectric film on a substrate, so as to be useful for the manufacture of an integrated circuit. The thermally degradable component is also soluble in a polar solvent or solvents employed to produce the film-forming mixture, e.g., water, alcohol, ketones and/or mixtures thereof.

The terms, "degradable" or "thermally degradable" as employed herein, in reference to the component that is to be thermally degraded under the heating conditions of the inventive process, includes both physical evaporation of a relatively volatile fraction of the thermally degradable component during the heating step(s) and/or degradation of the component(s) into more volatile molecular fragments. Without wishing to be bound by any theory or hypothesis, it is believed that the heating steps degrade the organic polymer component by either direct vaporization or chemical disruption of the polymer by the applied heat, or disruption of the polymer by any reactive species induced in the film structure by the applied heat. In any event, the thermal degradation of the organic polymer component forms nanometer-scale voids in the film structure.

It is also important that the thermally degradable component be substantially nonvolatile prior to the heating step, i.e., at room temperature. Thus, the thermally degradable component is not so volatile as to significantly evaporate prior to the time during the heating of the film when the silicon polymer(s) begins to achieve cross-linking. As confirmed by the Examples provided below, if significant evaporation does take place too early in the process, the resulting film density, and therefore the dielectric constant, will be higher than would otherwise be produced in that film. Thus, without meaning to be bound by any theory or hypothesis as to how the invention operates, it is believed that undesirable "significant" pre-heating evaporation is evaporation that takes place prior to the cross-linking of the S.O.G. material at such a rate and in such a proportion of the applied film, so as to result in the production of an undesirably dense dielectric film.

The term, "polymer" as employed herein also encompasses the terms oligomers and/or copolymers, unless expressly stated to the contrary.

Preferred thermally degradable polymers according to the invention will have molecular weights in a range that is effective to be thermally degraded in the temperature range of the heating steps, but the molecular weight should not be so low as to allow significant evaporation prior to the baking step(s), for the reasons discussed above. Preferably, thermally degradable polymer(s) employed according to the invention will have a molecular weight ranging from about 200 to about 2,000,000, or more, Daltons. More preferably, such a polymer will have a molecular weight ranging from about 600 to about 30,000 Daltons, or even from about 2,000 to about 7500 Daltons.

In another preferred embodiment, the thermally degradable polymer according to the invention is a polyalkylene oxide. The polyalkylene oxide includes an alkyl moiety, ranging, e.g., from $C_2$ to about $C_6$. Simply by way of example, in one embodiment, the thermally degradable component will include a polyethylene oxide and polypropylene oxide and copolymers thereof. Other suitable thermally degradable polymers include, without limitation, polyvinyl alcohol and water soluble polyethylene oxide/polypropylene oxide copolymers and mixtures thereof. Polyethylene oxide is exemplified by the Examples below.

Solvents

A suitable solvent or co-solvent optionally employed in the film forming mixture that is applied to the substrate will, broadly, be a polar solvent that has a boiling point of 200° C. or less, and preferably the boiling point will range from about 80° C. to about 160° C. Simply by way of example, and without limitation, polar solvents useful according to the invention include water; alcohols, e.g., ethanol or isopropanol; ketones, e.g., acetone, and mixtures thereof.

Process Parameters

In the processes of the invention, the prepared mixture of S.O.G. material(s), i.e. silicone-based polymer(s), thermally degradable polymer(s) and/or oligomers and optional solvent(s) is applied to a suitable substrate by an appropriate art-known means. When the mixture is applied to the substrate by centrifugation, i.e., when it is spun-on, the conditions are those conventionally used for such application, e.g., the substrate is spun at about 2,000 to 4,000 rpms. The artisan will appreciate that specific conditions for application to a substrate will depend upon the selected materials, substrate and desired nanoscale pore structure, as is readily determined by routine manipulation of these parameters.

The applied film is then baked and thereafter cured to form the nanoscale pore structures within the film, by thermally induced evaporation or decomposition of the PEO component. Baking is done at a temperature and for a time period effective to thermally degrade and/or vaporize the PEO and cause such nanoscale pores to form. Preferably, baking is done on a hot plate and/or in a oven, and optionally on a conveyer belt moving through a suitable hot zone. In a preferred embodiment, baking temperatures range from about 60° C. to about 350° C., more preferably from about 70° C. to about 300° C. or from about 80° C. to about 250° C.

Baking times will depend upon the materials selected and the desired results, but will generally range from about 30 seconds to about 10 minutes in the about 60° C. to about 350° C. temperature range; from about 0.5 to about 6 minutes in the about 70° C. to about 300° C. temperature range; and from about 0.5 to about 3 minutes in the about 80° C. to about 250° C. temperature range.

The artisan will appreciate that specific temperature ranges and baking and/or curing conditions will depend upon the selected materials, substrate and desired nanoscale pore structure, as is readily determined by routine manipulation of these parameters.

Properties Of the Produced Nanoporous Silica Films

Nanoporous dielectric films formed on a substrate according to the invention are generally formed with a pore size that ranges from about 1 nm to about 100 nm, more preferably from about 2 nm to about 30 nm, and most preferably from about 3 nm to about 20 nm. The density of the silicon-containing composition, including the pores, ranges from about 0.1 to about 1.9 $g/cm^3$, more preferably from about 0.25 to about 1.6 $g/cm^3$, and most preferably from about 0.4 to about 1.2 $g/cm^3$.

Thus, the percentage of the nanoporous dielectric film produced by the methods of the invention that are represented by void space, i.e., nanometer scale pores, can range, e.g., from about 10 to about 70 percent, or greater, and preferably from about 20 to about 50 percent.

The refractive index is another indicator of the relative density of dielectric films produced from S.O.G. materials. The refractive index of the methylsiloxane starting materials that are exemplified herein range from about 1.30 to about 1.40. The refractive index of the dielectric films produced by the inventive methods range in value from about 1.15 to about 1.4, and more preferably from about 1.19 to about 1.31.

Given the low densities achieved by the methods and compositions of the invention, low dielectric constant or k values are attainable, ranging from about 1.5 to about 3.8, preferably from about 1.8 to about 3.0, and more preferably from about 1.8 to about 2.8.

EXAMPLES

Porous methylsiloxane coating is produced from the hermal degradation of an organic component from a film prepared from a mixture of an S.O.G. such a thermally degradable organic polymer in a polar solvent. The exemplified S.O.G. base materials are methylsiloxanes, the AMM 512B and the AMM 311, discussed above. The exemplified organic component is polyethylene oxide ("PEO"). The artisan will appreciate that PEOs and/or a mixture of PEOs, are selected for use in the inventive processes to thermally degrade in a temperature range that is relatively low compared to the thermal tolerances of the employed substrate and S.O.G. materials, to be soluble in polar solvents that are compatible with the inventive processes, and to be miscible with the selected S.O.G. materials. Processing steps include dissolving the PEO in the S.O.G. in an appropriate amount, then casting the mixture onto the substrate by spinning, and then baking and optionally curing the spun film at a temperature range and for a time period or periods appropriate for the selected S.O.G. material. The following non-limiting examples serve to illustrate the invention.

Example 1

Films Formed by the Removal Of Polyethylene Oxide

Materials

A) Base Matrix Materials

Base matrix materials that form the backbone of the nanoporous foams were S.O.G. methylsiloxanes AMM 512B and 311. Table 2, below, lists the properties of the AMM methylsiloxanes.

TABLE 2

| Properties of Methylsiloxanes | | |
|---|---|---|
| | AMM 311 | AMM 512B |
| % solid | 10.5 | 14.7 |
| % water | 8 | 10 |

TABLE 2-continued

Properties of Methylsiloxanes

| | AMM 311 | AMM 512B |
|---|---|---|
| Organic Content | 10 wt % | 14 wt % |
| Dielectric Constant | 3.8 | 3.1 |
| Refractive Index | 1.39 | 1.38 |
| Additional Solvents | isopropyl alcohol, ethyl alcohol, acetone | isopropyl alcohol, ethyl alcohol, acetone |

A) Thermally Degradable Components

Three polyethylene glycols with different molecular weights were used:
  (i) MW=200 (PEO-200)–liquid
  (ii) MW=600 (PEO-600)–wax
  (iii) MW=7500 (PEO-7500)–crystalline solid (mp=72° C.)

A) Preparation of the Spin-On Solutions

Different amounts of PEO were employed, in amounts ranging from 1 to 22 percent by weight, relative to the methylsiloxane solutions. To dissolve PEO-7500, the solution was heated to above 60° C. For the other two PEOs, stirring at room temperature was sufficient to complete dissolution. Symbol designated to describe the coating solutions is (base matrix)-(MW of PEO)-(wt. % of PEO) in as-spun form. For example, 512B-7500-26 represents a composition of 26 wt % of PEO-7500 and 74 wt % of 512B in the as-spun form (sample "I" in Table 3, below). For convenience in description, each combination is also given an alphabetic designation. The following samples were prepared, as listed in Table 3, below.

TABLE 3

Coating Mixtures

| Sample No. | Base Matrix Solution | Wt Base Solution (grams) | MW PEO | Wt of PEO (grams) | (Summary) |
|---|---|---|---|---|---|
| A | 311 | 10.10 | 200 | 0.55 | 311-200-34 |
| B | 311 | 10.21 | 200 | 1.18 | 311-200-51 |
| C | 311 | 30.00 | 600 | 1.71 | 311-600-35 |
| D | 311 | 30.67 | 600 | 3.15 | 311-600-49 |
| E | 311 | 30.05 | 7500 | 0.34 | 311-7500-10 |
| F | 311 | 21.78 | 7500 | 2.31 | 311-7500-49 |
| G | 311 | 16.99 | 7500 | 2.61 | 311-7500-57 |
| H | 311 | 19.50 | 7500 | 4.43 | 311-7500-65 |
| I | 512B | 30.00 | 7500 | 1.55 | 512B-7500-26 |
| J | 512B | 21.68 | 7500 | 2.17 | 512B-7500-39 |
| K | 512B | 28.97 | 7500 | 4.35 | 512B-7500-48 |
| L | 512B | 29.10 | 7500 | 6.40 | 512B-7500-56 |

The prepared samples, as described by Table 3, above, were then spun onto suitable test substrates, which were flat wafers of about 4 or 6 inch oxide-coated silicon wafers.

Bake/Cure Cycles

Hot plate bake temperatures were 80, 150, and 250° C. for 2 minutes at each temperature. The as-spun films were hazy, but the films became clear after the 250° C. bake. However, there was smoking during the 150 and 250° C. bake steps, resulting from the volatilization and removal of the PEG. The baked films were then cured at 400° C. for 30 minutes in flowing nitrogen.

Example 2

Analysis of Films by Fourier Transformed Infrared ("FTIR") Spectroscopy

The film samples were prepared as described above in Example 1 using the F and J starting materials. The spun-on films were then treated with 80, 150 and 250° C., as baking steps and were subjected to FTIR analysis [spectra not shown] after each baking step. A broad absorption peak was obtained between 2800 $cm^{-1}$ to 3000 $cm^{-1}$ that confirmed the presence of the organic PEO in the film. The peak intensity, i.e., amplitude of the PEO signal, remained essentially constant until the 250° C. baking step, as is recorded in Table 4, below.

TABLE 4

FTIR Analysis
Peak High Ratio Between Peaks at 2830 $cm^{-1}$ to 1050 $cm^{-1}$

| Baking Step | Sample F (311-7500-49) Peak Height Amplitude* | Sample J (512B-7500-39) Peak Amplitude* |
|---|---|---|
| 80 Deg. C. | 0.322 | 0.243 |
| 150 Deg. C. | 0.332 | 0.257 |
| 250 Deg. C. | 0** | 0** |

*Absolute value above baseline
**Minor bump in nearly level curve at approximately 2970 $cm^{-1}$ - this is indicative of the organic moiety from the 311 or 512B As shown in Table 4, above, peak measurements confirmed that PEO was still present in the film in substantial amounts after the bake at 150° C., but was almost completely removed after the last bake at 250° C. Therefore, it is believed that the porous structure took shape during the third bake step.

Additional FTIR of the films produced from F and J, after they were cured at 400° C., showed virtually no trace of the PEO component in the 2800 $cm^{-1}$ to 3000 $cm^{-1}$ band (except for a miniscule blip at approximately 2970 $cm^{-1}$). Thus, the 400° C. cured films yielded FTIR spectra for both the 311 and the 512B derived films which are essentially the same as those of pure AMM311 and AMM512B.

Example 3

Measurements Of Thickness Of Produced Films

Film thickness was measured using Nanospec, Tencor, and Gaertner instruments. Data from Nanospec and Tencor appeared to give inconsistent results. A more reliable film thickness can be obtained from the Gaertner machine in double-angle mode. Thickness of one selected film was measured in SEM. The SEM thickness was in line with the result obtained from the Gaertner elipsometer. The major shrinkage occurred in the 250° C. bake step. The thickness of the nanoporous film that resulted after each processing step using mixtures F and J, respectively, are listed in Table 5, as follows.

TABLE 5

Bake/Cure Film - Thickness in Ångstroms

| Sample No. | Total solid in Solution (%) | Spin Speed (rpm) | Thickness after 80° C. | Thickness after 150° C. | Thickness after 250° C. | Thickness after 400° C. |
|---|---|---|---|---|---|---|
| F | 19.1 | 3000 | 12860 Å | 12350 Å | 7770 Å | 7156 Å |
| J | 22.5 | 5000 | 12550 Å | 12100 Å | 8400 Å | 7880 Å |

Example 4

Measurements Of Refractive Index

Refractive indexes ("R.I.") were measured using a Gaertner elipsometer and are tabulated in Table 6, below. The refractive indexes of the cured base materials AMM311 and AMM512B were determined by this method to be 1.39 and 1.38, respectively.

Example 5

Measurements Of Dielectric Constant

The dielectric constant (k) of the cured films was calculated from the capacitance of each film with thickness (t) under aluminum dot, using a Hewlett-Packard LCR meter model HP4275A. The dielectric constant (k) was calculated according to the following equation:

$$k = Ct/(E_o A),$$

where A is the area of the Al dot ($cm^2$), C is the capacitance (Farad), t is the film thickness (cm) and $E_o$ is the permittivity of free space ($8.85419 \times 10^{-14}$ F/cm). Dielectric constants with an error bar of about ±0.1 are listed in the last column of Table 6, as follows.

sured dielectric constant decreases. Analogous results were seen with samples F-1, F-2, G, and H, prepared using AMM 311, and which had PEO (7500) weight percentages of 49, 57 and 65, with measured dielectric constants declining from 2.43 to 2.11 as the weight percentages of PEO in the as-spun film rose to 65, thus confirming the effectiveness of the instant methods. In contrast, it should be noted that the dielectric constants of the base materials 400° C. cured 311 and 512B are 3.8 and 3.1, respectively.

The dielectric constants for the films produced using the 311 series and the 512B series, as shown in Table 6, were plotted against the weight percent of the PEO to produce [plotted figures not shown]. The resulting plots of the Table 6 data confirm that dielectric films produced using both the AMM 311 and 512B methylsiloxane S.O.G. materials exhibit reduced dielectric constant properties in roughly linear proportion to the weight percentage of the thermally degradable component of the as-spun film. The plotted data also confirms that the nanoporous films produced using AMM 512B base material exhibited k values that were

TABLE 6

Refractive Index and Dielectric Constant

| Sample No. | Wt % PEO in S.O.G. | Wt % PEO in as-spun film | Refractive Index 512-7500 | Refractive Index 311-200 | Refractive Index 311-600 | Refractive Index 311-7500 | Dielectric constant |
|---|---|---|---|---|---|---|---|
| A | 5.1 | 34 | 1.372 | | | | —* |
| B | 10.4 | 51 | 1.314 | | | | — |
| C | 5.4 | 35 | | | 1.268 | | — |
| D | 9.5 | 49 | | | 1.224 | | — |
| D | 9.5 | 49 | | | 1.219 | | 2.63 |
| E | 1.1 | 10 | | | | 1.326 | — |
| F-1 | 9.5 | 49 | | | | 1.186 | 2.32 |
| F-2 | 9.5 | 49 | | | | 1.202 | 2.43 |
| G | 13.5 | 57 | | | | 1.19 | 2.19 |
| H | 18.5 | 65 | | | | 1.173 | 2.11 |
| I | 4.9 | 26 | 1.309 | | | | 2.73 |
| J | 9.1 | 39 | 1.235 | | | | 2.36 |
| K-1 | 13 | 48 | 1.228 | | | | 2.18 |
| K-2 | 13 | 48 | 1.214 | | | | 2 |
| L | 18 | 56 | 1.197 | | | | 2.02 |

*"—" no data

Analysis

As can be seen in Table 6, above, the resulting films have dielectric constants ranging from 2 to 2.73. The degree of porosity of each film can be estimated from the weight percent of the thermally degradable component (PEO), in the as-spun film by assuming that the densities of the base material and the thermally degradable component are the same and that no loss of the evaporative component either through evaporation or degradation mechanism occurs before the crosslinking of the base material. The weight percent of the PEO in various films is listed in the third column of Table 6 and can be used as an indicator of the degree of porosity of the film, with the exception of the PEO 200 samples, where there was evidence, as discussed below, that the more volatile PEO 200 evaporated prior to the 200° C. heating step. Thus, Samples I, J, K-1, K-2 and L, prepared using AMM 512B, and which had PEO (7500) weight percentages in the as-spun films of 26, 39, 48 and 56, respectively, were determined to have dielectric constant values of 2.73, 2.36, 2.18, 2 and 2.02, respectively (two different films were produced and measured using Sample K). Within this series, it can be appreciated that as the PEO weight percentages in the as-spun films increases, the mealower, by about 0.3, than the k values of the nanoporous films produced using the AMM base material 311. This lower range of k values seems to be consistent with the lower dielectric constant of the unmodified 512B base material. Since the exact degree of porosity is not determined, quantitative analysis of the relationship between dielectric constant and porosity for these systems cannot be established. However, as confirmed by the tabulated data, the dependence of k on the percentage of PEO in the as-spun film is understood and controllable.

The refractive index vs. the weight percent of PEO, as shown in Table 6, was plotted [figure not shown] for the films produced using both the AMM 311 and AMM 512B series of base materials. The plotted data confirms that the refractive index for both film series falls into the same line. However, when the refractive index data for the film produced using the PEO 200 starting mixture is compared to the linear plots of the other data, the PEO 200 refractive index falls substantially outside of (and above) the values predicted by the linear relationship between the refractive index and PEO weight % of the other films. Without meaning to be bound by any theory or hypothesis, it is believed that this non-linear elevation in refractive index confirms that the film formed using PEO 200 is simply denser than would otherwise be expected, because less PEO 200 remained in the film prior to formation of the pore structures.

Conclusions (1) For the series of films produced using starting mixtures incorporating PEO compounds having molecular weights of 600 and 7500, and the AMM311 and AMM512B base materials, respectively, the refractive indexes of the films are similar, at the same respective PEO weight fraction. While not wishing to be bound by any theory or hypothesis, it is believed that this may indicate a similar degree of porosity in the respective films, since the refractive indexes of the two base materials are also very close (1.38 vs. 1.39).

(2) The dielectric constant of the series of films produced using the AMM512B base material is lower than that of the 311 series when the respective films are compared at the same PEO loading. Judging from results from the k and R.I. data, it can be inferred that at the same loading of PEO 600 and 7500, a similar level of porosity is obtainable from either 311 and 512B, but that the porous film of similar porosity exhibits different k value due to the differences in base material.

(3) PEO 200 is a viscous liquid with appreciable vapor pressure at 200° C. The refractive indexes of the two films prepared from the PEO 200 were higher than the predicted value based on the no-loss assumption. Although the dielectric constant of these films was not measured it is reasonable to conclude that if a substantial amount of the PEO 200 evaporated during the baking step due to its volatility, then the final porosity will be much less than the value calculated from the proportion of PEO 200 present in the as-spun film composition. The absolute volume fraction in the porous film is not known, but the weight fraction of PEO is believed to be proportional to the volume fraction, or the degree of porosity, although the exact value of the porosity has not determined to date.

Example 6

Scanning Electron Microscopic (SEM) Examination of Film Surface

A nanoporous film was prepared using sample K (512B-7500-13). A sufficient quantity of sample K was spin-coated onto a substrate, which was a flat silicon wafer with a thickness of 9580 Å, and the film was finished as described above for Example 1.

The surface of the film was then prepared for SEM by standard, art-known methods The film surface was examined using a Joel JSM-6300 F scanning electron microscope ("SEM") at 2.5 kilovolts, with a magnification of 50,000, and a field width of 10 nm. Under these conditions, the surface of the dielectric film exhibited a uniform texture, with no cracking and no large pores [image not shown].

Example 7

Stud Pull Test

Methods

The stud pull test was conducted by the following method.

A film to be tested is placed on substrate wafer, and an epoxy test stud was epoxied to the top of the film. Once the epoxy has cured, the stud was pulled away from the film, with a measured force, until some component broke. The measured pull force at the moment just prior to breakage was the stud pull strength.

Tests

The stud pull test was performed on 7500–8000 Å films spun from the PEO 7500-containing formulation. A 6" silicon wafer with a 500 Å thermal oxide layer was used. In addition, a 1 μm layer of aluminum was deposited on top of the film prior to attaching the stud to the wafer. Stud pull results are shown in Table 7, below.

TABLE 7

Stud Pull Results

| AMM/PEG Mixture | Stud Pull Strength, Kpsi* | Standard Deviation |
|---|---|---|
| F | 1.5 | 1.0 |
| G | 1.1 | 0.5 |
| H | 1.6 | 1.1 |
| J | 2.4 | 1.1 |
| K | 1.5 | 1.2 |

*kilopounds/inch$^2$

Analysis of Stud Pull Results

The tested films all failed at the interface between the thermal oxide and the film, not in the film itself However, it should be appreciated that the stud pull tests obtained even under the interphase failure conditions are still significantly higher than respective porous nanosilica films at the same k value. For example, the stud pull test result for sample H having a k of 2.11 was 1.6 Ksi, which would be much higher than the projected stud pull of less than 0.5 Ksi for the corresponding nanosilica dielectric film having a k of 2.1.

Furthermore, for experimental convenience, in the test samples as prepared above, the dielectric films were deposited on the substrate over a thermal oxide layer, formed by simply heating the silicon wafer in air. For actual production of integrated circuits, art-known chemical vapor deposition ("CVD") materials are preferably employed, such as, e.g., plasma enhanced CVD tetraethoxysilane oxide ("PETEOS") or silane oxide and combinations thereof, to form the layer between the wafer and the applied nanoporous dielectric film. With these alternative materials, the adhesion between the oxide layer of the wafer and the nanoporous film is significantly enhanced.

Conclusion

Porous methylsiloxane films were produced by heating a thermally degradable component of a methylsiloxane precursor/polyethylene oxide blend, leaving behind a foam structure with the methylsiloxane as the skeleton. A conventional, art known coater and furnace were used for the processing. In this example, dielectric constants ranging from 2.8 to 2.0 were achieved by adjusting the amount of thermally degradable component in the polymer blend. When methylsiloxane 512B was employed, the as-spun film, containing 50 wt % polyethylene oxide, produced a k value of about 2.1. Films with a k lower than 2.1 can be prepared by increasing the amount of polyethylene oxide at expense of further decreasing the mechanical strength of the film. Of course, the above-described stud pull test confirms that the nanoporous films produced by the process is internally cohesive, at least in the tested ranges of PEO weight percentages. In conclusion, the foregoing examples demonstrate that polyethylene oxide is an excellent thermally labile, thermally degradable component for making low-k methylsiloxane spin-on dielectrics.

What is claimed is:

1. A low dielectric nanoporous film comprising a spin-on glass base material, said film produced by a process comprising the steps of (a) preparing a mixture of at least one spin-on-glass material with a thermally degradable polymer soluble in a polar solvent, (b) applying the mixture of step (a) onto a substrate to produce a coated substrate, (c) heating the coated substrate of step (b) for a time and at one or more temperatures effective to produce the desired low dielectric nanoporous film.

2. The low dielectric nanoporous film of claim 1 having a dielectric constant ranging from about 1.5 to about 3.8.

3. The low dielectric nanoporous film of claim 1 having a dielectric constant ranging from about 1.8 to about 3.0.

4. The low dielectric nanoporous film of claim 1 having a refractive index ranging from about 1.40 to about 1.10.

5. The low dielectric nanoporous film of claim 1 produced from a spin on glass base material of Formula I:

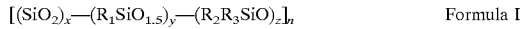

$$[(SiO_2)_x—(R_1SiO_{1.5})_y—(R_2R_3SiO)_z]_n \qquad \text{Formula I}$$

wherein $R_1$, $R_2$ and $R_3$ are independently selected from the group consisting of an organic moiety and combinations thereof and $1 \geq x \geq 0$; $1 \geq y \geq 0$; $1 \geq z \geq 0$, provided that x+y+z is 1.0.

6. The low dielectric nanoporous film of claim 5 wherein said organic moiety is a $C_{1-6}$ alkyl.

7. The low dielectric nanoporous film of claim 5 wherein the spin-on-glass base material comprises an $SiO_2$ moiety, and x is 1.

8. The low dielectric nanoporous film of claim 5 wherein the spin-on-glass base material comprises a polymethylsilsesquioxane, and y is 1 and $R_1$ is methyl.

9. The low dielectric film coating of claim 5 wherein the spin-on-glass base material comprises at least one alkylsiloxane.

10. The low dielectric nanoporous film of claim 9 wherein the alkylsiloxane is a methylsiloxane.

11. The low dielectric nanoporous film of claim 10 wherein the methylsiloxane has a formula according to Formula I, wherein x, y and z are all greater than zero, and $R_1$, $R_2$ and $R_3$ are methyl.

12. The low dielectric nanoporous film of claim 1 wherein the thermally degradable polymer ranges in molecular weight from about 200 to about 2,000,000 Daltons.

13. The low dielectric nanoporous film of claim 12 wherein the thermally degradable polymer ranges in molecular weight from about 600 to about 30,000 Daltons.

14. The low dielectric nanoporous film of claim 12 wherein the thermally degradable polymer is a polyalkylene oxide.

15. The low dielectric nanoporous film of claim 14 wherein the polyalkylene oxide is selected from the group consisting of polyethylene oxide and polyethylene oxide/propylene oxide copolymers.

16. The low dielectric nanoporous film of claim 1 wherein the heating of step (c) comprises a baking step and a curing step.

17. The low dielectric nanoporous film of claim 16 wherein the baking step comprises a plurality of heating steps, ranging in temperature from about 60° C. to about 300° C., and each heating step is for a time period ranging from about 0.5 to about 4 minutes.

18. The low dielectric nanoporous film of claim 16 wherein the baking comprises a first heating step of about 80° C., a second heating step of about 150° C., and a third heating step of about 250° C., each heating step being applied for a duration of about 2 minutes at each respective temperature.

19. The low dielectric nanoporous film of claim 18 wherein the curing step comprises heating the baked film at a temperature of at least 400° C. and for a time period ranging from about 10 to about 60 minutes.

20. The low dielectric nanoporous film of claim 1 wherein the spin-on glass comprises a silicon-based polymer comprising a subunit selected from the group consisting of, $SiO_2$; $Q_1SiO_3$; $Q_2Q_3SiO_2$; and $Q_4Q_5Q_6SiO$ and combinations thereof, wherein $Q_1$, $Q_2$, $Q_3$, $Q_4$, $Q_5$ and $Q_6$ are independently organic.

21. The low dielectric nanoporous film of claim 20 wherein when any of $Q_1$, $Q_2$, $Q_3$, $Q_4$, $Q_5$ and $Q_6$ is organic, the organic moiety is a $C_{1-6}$ alkyl.

22. The low dielectric nanoporous film of claim 1 wherein the substrate is suitable for use in producing an integrated circuit.

23. The low dielectric nanoporous film of claim 22 wherein the substrate comprises a semiconductor material selected from the group consisting of gallium arsenide, silicon, and mixtures thereof.

24. The low dielectric nanoporous film of claim 23 wherein the silicon material is selected from the group consisting of crystalline silicon, polysilicon, amorphous silicon, epitaxial silicon, and silicon dioxide.

25. The low dielectric nanoporous film of claim 22 wherein the substrate comprises a surface layer applied by chemical vapor deposition selected from the group consisting of plasma enhanced chemical vapor deposition tetraethoxysilane, silane oxide and combinations thereof.

26. The low dielectric nanoporous film of claim 1 wherein the thermally degradable polymer is soluble in a polar solvent selected from the group consisting of water, alcohol, ketones and mixtures thereof.

27. An integrated circuit comprising at least one low dielectric nanoporous film of claim 1.

28. A method of producing a low dielectric nanoporous film on a substrate comprising the steps of, (a) preparing a mixture of a suitable spin-on-glass material with a thermally degradable polymer soluble in a polar solvent, (b) applying the mixture of step (a) onto a substrate, to produce a coated substrate, (c) heating the coated substrate of step (b) for a time and at one or more temperatures effective to produce the desired low dielectric nanoporous film on said substrate.

* * * * *